(12) United States Patent
Rusu et al.

(10) Patent No.: US 7,645,707 B2
(45) Date of Patent: Jan. 12, 2010

(54) ETCH PROFILE CONTROL

(75) Inventors: Camelia Rusu, Fremont, CA (US); Zhisong Huang, Fremont, CA (US); Mukund Srinivasan, Fremont, CA (US); Eric A. Hudson, Berkeley, CA (US); Aaron Eppler, Fremont, CA (US)

(73) Assignee: Lam Research Corporation, Fremont, CA (US)

( * ) Notice: Subject to any disclaimer, the term of this patent is extended or adjusted under 35 U.S.C. 154(b) by 387 days.

(21) Appl. No.: 11/095,932

(22) Filed: Mar. 30, 2005

(65) Prior Publication Data

US 2006/0226120 A1    Oct. 12, 2006

(51) Int. Cl.
    *H01L 21/302* (2006.01)
(52) U.S. Cl. .................. 438/723; 438/706
(58) Field of Classification Search ............. 438/706, 438/723; 252/79.1, 79.4
    See application file for complete search history.

(56) References Cited

U.S. PATENT DOCUMENTS

| | | | | |
|---|---|---|---|---|
| 4,208,241 A * | 6/1980 | Harshbarger et al. | ......... | 216/67 |
| 5,376,228 A | 12/1994 | Yanagida | | |
| 6,057,239 A * | 5/2000 | Wang et al. | ................. | 438/689 |
| 6,187,688 B1 * | 2/2001 | Ohkuni et al. | ............... | 438/725 |
| 6,287,980 B1 * | 9/2001 | Hanazaki et al. | ............. | 438/726 |
| 6,492,263 B1 * | 12/2002 | Peng et al. | ................... | 438/639 |
| 6,630,407 B2 | 10/2003 | Keil et al. | | |
| 6,635,185 B2 * | 10/2003 | Demmin et al. | ............... | 216/64 |
| 6,746,961 B2 | 6/2004 | Ni et al. | | |
| 2003/0216031 A1 * | 11/2003 | Komagata | ................... | 438/636 |
| 2006/0270230 A1 | 11/2006 | Abatchev et al. | | |

FOREIGN PATENT DOCUMENTS

| | | |
|---|---|---|
| EP | 0 498 209 A1 | 8/1992 |
| EP | 0 498 209 B1 | 8/1992 |
| EP | 0516053 A2 | 12/1992 |
| EP | 0903777 A1 | 3/1999 |
| FR | 2673763 A1 | 9/1992 |
| JP | 2000-277494 | 10/2000 |
| JP | 2004-087896 A | 3/2004 |
| JP | 2004363150 A * | 12/2004 |
| WO | 97/24750 | 7/1997 |
| WO | 2006/107495 A1 | 10/2006 |

OTHER PUBLICATIONS

Arita et al., Method of Forming Pattern, Jun. 6, 2003, English Abstract and Computer translation of JP 200436150 A, 12 pages.*

(Continued)

*Primary Examiner*—Kin-Chan Chen
(74) *Attorney, Agent, or Firm*—Beyer Law Group LLP

(57) ABSTRACT

A method for etching a dielectric layer over a substrate and disposed below a mask is provided. The substrate is placed in a plasma processing chamber. An etchant gas comprising $O_2$ and a sulfur component gas comprising at least one of $H_2S$ and a compound containing at least one carbon sulfur bond is provided into the plasma chamber. A plasma is formed from the etchant gas. Features are etched into the etch layer through the photoresist mask with the plasma from the etchant gas.

7 Claims, 5 Drawing Sheets

OTHER PUBLICATIONS

International Search Report and Written Opinion, mailed Sep. 11, 2006.
Written Opinion dated Dec. 1, 2008 from Singapore Patent Application No. 200708501-2.
Search Report dated Dec. 1, 2008 from Singapore Patent Application No. 200708501-2.
International Search Report dated Feb. 23, 2009 from International Patent Application No. PCT/US2008/076435.
Written Opinion dated Feb. 23, 2009 from International Patent Application No. PCT/US2008/076435.
Examination Report dated Aug. 18, 2009 from Singapore Patent Application No. 200708501-2.

* cited by examiner

ETCH PROFILE CONTROL

BACKGROUND OF THE INVENTION

The present invention relates to etching an etch layer through a mask during the production of a semiconductor device. More specifically, the present invention relates to etching a dielectric layer through a photoresist mask during the production of semiconductor devices.

During semiconductor wafer processing, features of the semiconductor device are defined in the wafer using well-known patterning and etching processes. In these processes, a photoresist (PR) material may be deposited on the wafer and then is exposed to light filtered by a reticle. The reticle may be a transparent plate that is patterned with exemplary feature geometries that block light from propagating through the reticle.

After passing through the reticle, the light contacts the surface of the photoresist material. The light changes the chemical composition of the photoresist material such that a developer can remove a portion of the photoresist material. In the case of positive photoresist materials, the exposed regions are removed, and in the case of negative photoresist materials, the unexposed regions are removed. Thereafter, the wafer is etched to remove the underlying material from the areas that are no longer protected by the photoresist material, and thereby produce the desired features in the wafer.

To provide increased density, feature size is reduced. This may be achieved by reducing the critical dimension (CD) of the features, which requires improved photoresist resolution.

In the etching of deep and narrow openings sidewall bowing may occur. Such bowing produces curved instead of straight sidewalls of the etched features.

SUMMARY OF THE INVENTION

To achieve the foregoing and in accordance with the purpose of the present invention a method for etching a dielectric layer over a substrate and disposed below a photoresist mask is provided. The substrate is placed in a plasma processing chamber. An etchant gas comprising $O_2$ and a sulfur component gas comprising at least one of $H_2S$ and a compound containing at least one carbon sulfur bond is provided into the plasma chamber. A plasma is formed from the etchant gas. Features are etched into the etch layer through the photoresist mask with the plasma from the etchant gas.

In another manifestation of the invention an apparatus for forming a features in a dielectric layer, wherein the dielectric layer is supported by a substrate and wherein the etch layer is covered by a photoresist mask is provided. A plasma processing chamber, comprises a chamber wall forming a plasma processing chamber enclosure, a substrate support for supporting a substrate within the plasma processing chamber enclosure, a pressure regulator for regulating the pressure in the plasma processing chamber enclosure, at least one electrode for providing power to the plasma processing chamber enclosure for sustaining a plasma, a gas inlet for providing gas into the plasma processing chamber enclosure, and a gas outlet for exhausting gas from the plasma processing chamber enclosure. A gas source is in fluid connection with the gas inlet and comprises a sulfur component gas source for providing at least one of $H_2S$ and a compound containing at least one carbon sulfur bond and an $O_2$ source. A controller is controllably connected to the gas source and the at least one electrode and comprises at least one processor and computer readable media. The computer readable media comprises computer readable code for providing an etchant gas comprising $O_2$ and a sulfur component gas comprising at least one of $H_2S$ and a compound containing at least one carbon sulfur bond into the plasma chamber, computer readable code for forming a plasma from the etchant gas, and computer readable code for providing plasma conditions to cause the etching of features into the dielectric layer through the photoresist mask with the plasma from the etchant gas.

In another manifestation of the invention a method for etching a silicon oxide based dielectric layer over a substrate and disposed below a photoresist mask is provided. The substrate is placed in a plasma processing chamber. An etchant gas comprising a fluorine component, $O_2$ and a sulfur component gas comprising at least one of $H_2S$ and a compound containing at least one carbon sulfur bond is provided into the plasma chamber, wherein the etchant gas has an etchant gas flow and the sulfur component gas has a sulfur component flow, wherein the sulfur component flow is between 0.1-10% of the etchant gas flow. A plasma is formed from the etchant gas. Features are etched into the etch layer through the photoresist mask with the plasma from the etchant gas.

These and other features of the present invention will be described in more detail below in the detailed description of the invention and in conjunction with the following figures.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION OF THE PREFERRED EMBODIMENTS

The present invention will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

Figure 1:
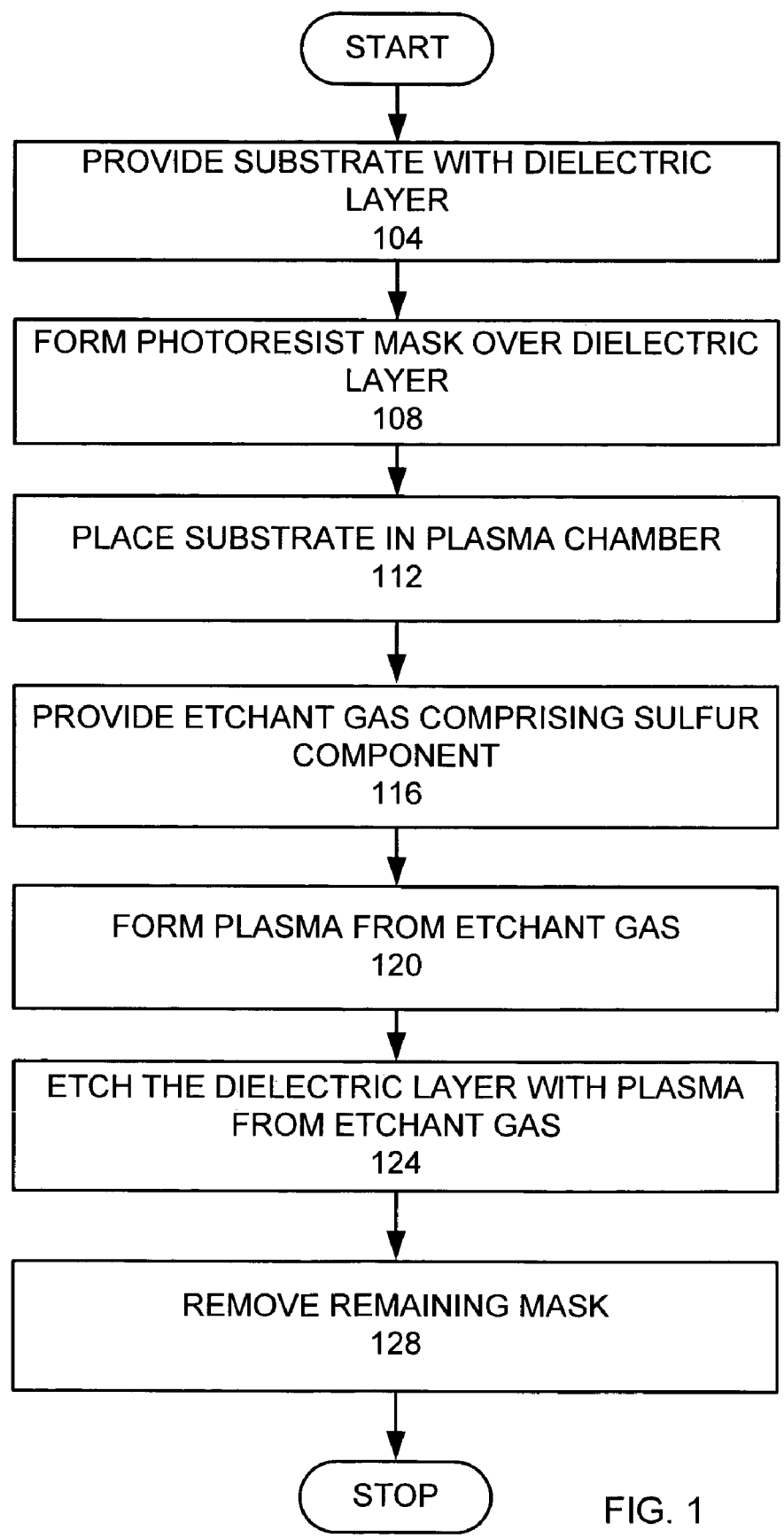
FIG. 1 is a flow chart of an embodiment of the invention.
Figure 2A:
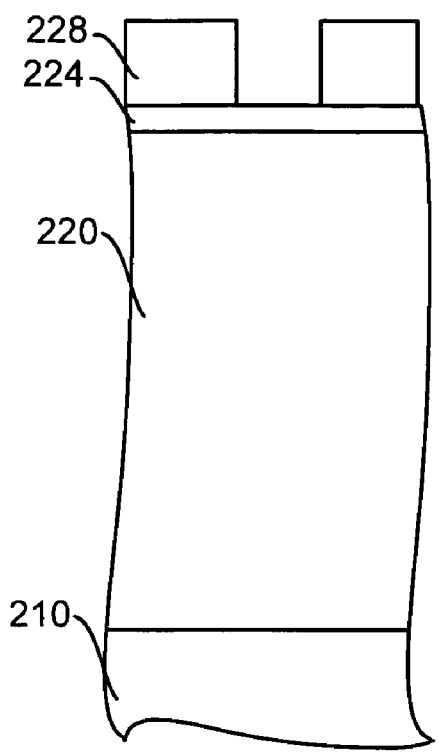
FIGS. 2A-B are schematic views of a layer etched in an embodiment of the invention.

To facilitate understanding, FIG. 1 is a high level flow chart of a process used in an embodiment of the invention. A substrate with a dielectric layer is provided (step 104). To facilitate understanding of the invention, FIG. 2A is a cross-sectional illustration of where a substrate 210 with a dielectric layer 220 is provided (step 104). In this embodiment of the invention, the substrate 210 is a silicon wafer and the dielectric layer 220 is a silicon oxide based low-k dielectric material or organic based low-k dielectric layer. In the preferred embodiment, an antireflective coating (ARC) layer 224 is placed over the etch layer 220. A photoresist mask 228, which is preferably 193 nm or above photoresist, is formed over the dielectric layer 220 (step 108). The substrate 210 is placed in an plasma processing chamber (step 112).

Figure 3:
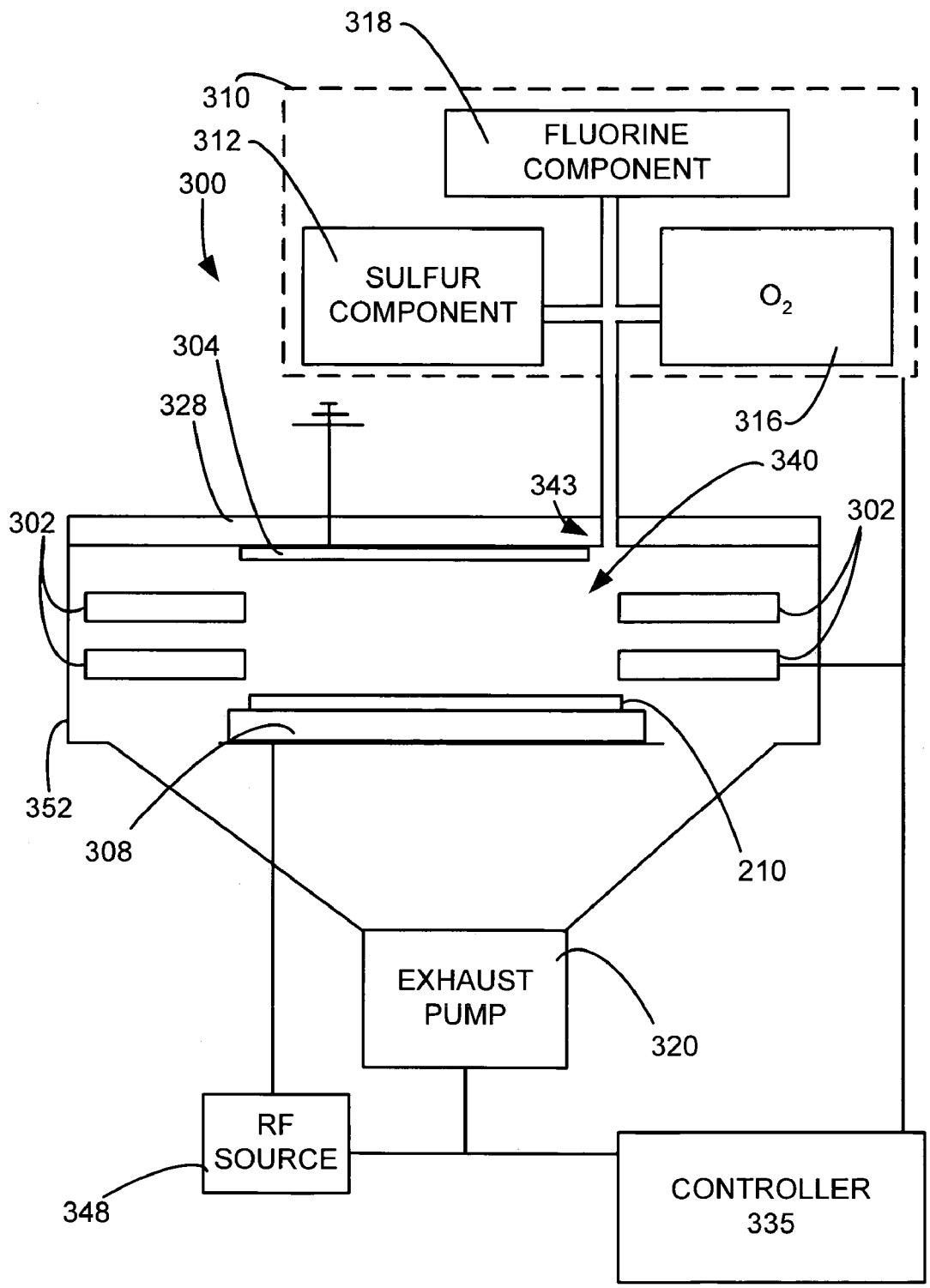
FIG. 3 is a schematic view of a plasma processing chamber that may be used for etching.

FIG. 3 is a schematic view of a plasma processing chamber 300 that may be used for inventive etching. The plasma processing chamber 300 comprises confinement rings 302, an upper electrode 304, a lower electrode 308, a gas source 310, and an exhaust pump 320. Within plasma processing chamber 300, the substrate 210 is positioned upon the lower electrode 308. The lower electrode 308 incorporates a suitable substrate chucking mechanism (e.g., electrostatic, mechanical clamping, or the like) for holding the substrate 210. The reactor top 328 incorporates the upper electrode 304 disposed immediately opposite the lower electrode 308. The upper electrode 304, lower electrode 308, and confinement rings 302 define the confined plasma volume. Gas is supplied to the confined plasma volume by the gas source 310 and is exhausted from the confined plasma volume through the confinement rings 302 and an exhaust port by the exhaust pump 320. Besides helping to exhaust the gas, the exhaust pump 320 helps to regulate pressure. In this embodiment, the gas source 310 comprises a sulfur component source 312, an $O_2$ source 316, and a fluorine component source 318. The gas source 310 may further comprise other gas sources. An RF source 348 is electrically connected to the lower electrode 308. Chamber walls 352 surround the confinement rings 302, the upper electrode 304, and the lower electrode 308. Different combinations of connecting RF power to the electrode are possible. In a preferred embodiment, the 27 MHz, and 2 MHz power sources make up the RF power source 348 connected to the lower electrode, and the upper electrode is grounded. A controller 335 is controllably connected to the RF source 348, exhaust pump 320, and the gas source 310.

Figure 4A:
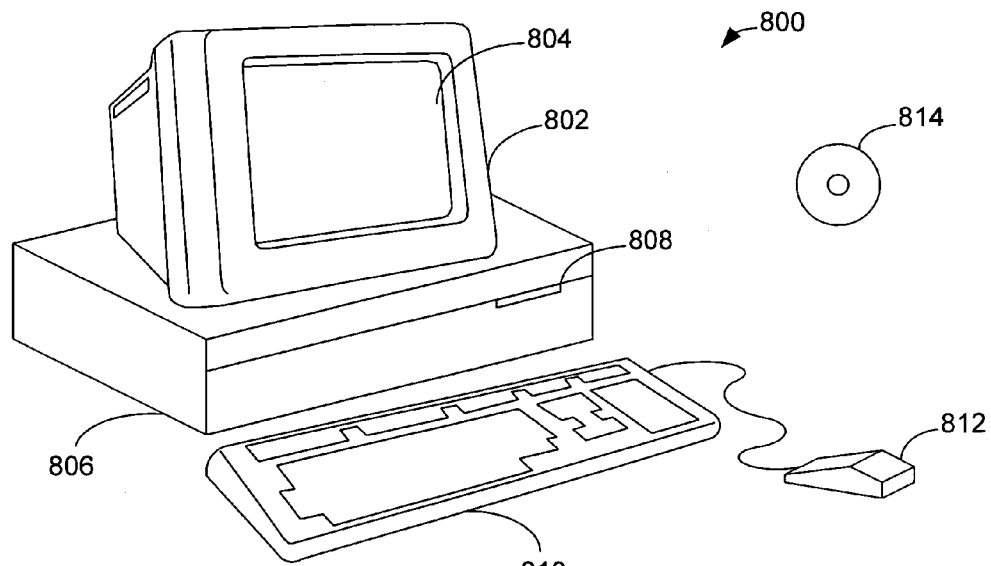
FIGS. 4A-B illustrate a computer system, which is suitable for implementing a controller used in embodiments of the present invention.
Figure 4B:
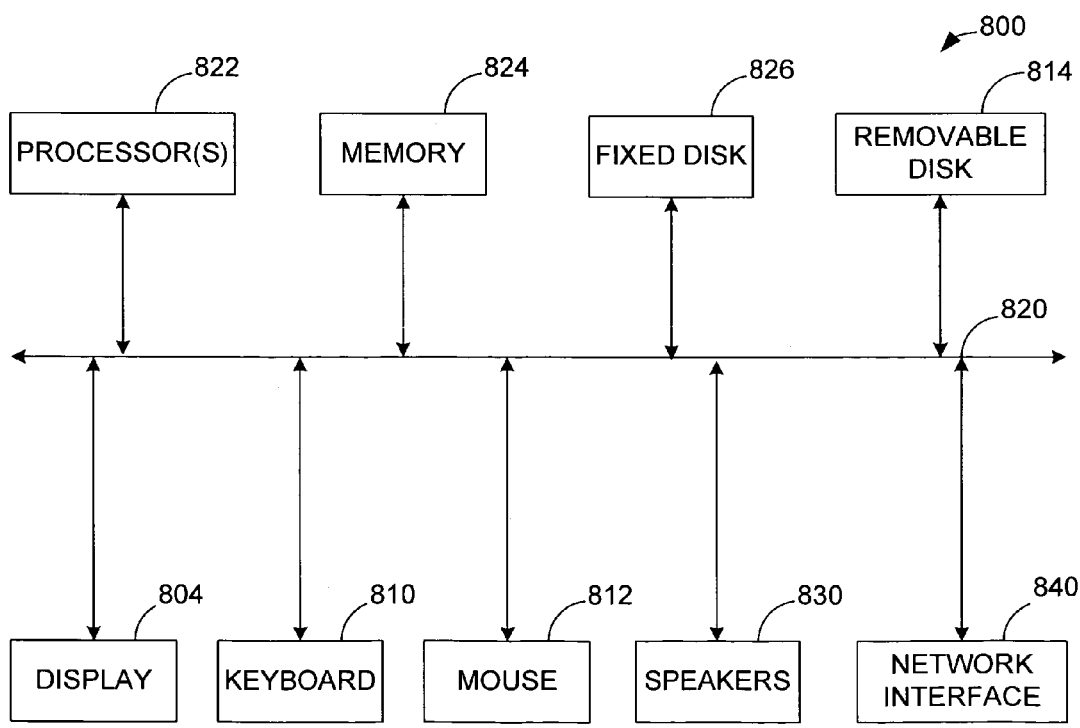

FIGS. 4A and 4B illustrate a computer system 800, which is suitable for implementing a controller 335 used in embodiments of the present invention. FIG. 4A shows one possible physical form of the computer system. Of course, the computer system may have many physical forms ranging from an integrated circuit, a printed circuit board, and a small handheld device up to a huge super computer. Computer system 800 includes a monitor 802, a display 804, a housing 806, a disk drive 808, a keyboard 810, and a mouse 812. Disk 814 is a computer-readable medium used to transfer data to and from computer system 800.

FIG. 4B is an example of a block diagram for computer system 800. Attached to system bus 820 are a wide variety of subsystems. Processor(s) 822 (also referred to as central processing units, or CPUs) are coupled to storage devices, including memory 824. Memory 824 includes random access memory (RAM) and read-only memory (ROM). As is well known in the art, ROM acts to transfer data and instructions uni-directionally to the CPU and RAM is used typically to transfer data and instructions in a bi-directional manner. Both of these types of memories may include any suitable of the computer-readable media described below. A fixed disk 826 is also coupled bi-directionally to CPU 822; it provides additional data storage capacity and may also include any of the computer-readable media described below. Fixed disk 826 may be used to store programs, data, and the like and is typically a secondary storage medium (such as a hard disk) that is slower than primary storage. It will be appreciated that the information retained within fixed disk 826 may, in appropriate cases, be incorporated in standard fashion as virtual memory in memory 824. Removable disk 814 may take the form of the computer-readable media described below.

CPU 822 is also coupled to a variety of input/output devices, such as display 804, keyboard 810, mouse 812, and speakers 830. In general, an input/output device may be any of: video displays, track balls, mice, keyboards, microphones, touch-sensitive displays, transducer card readers, magnetic or paper tape readers, tablets, styluses, voice or handwriting recognizers, biometrics readers, or other computers. CPU 822 optionally may be coupled to another computer or telecommunications network using network interface 840. With such a network interface, it is contemplated that the CPU might receive information from the network, or might output information to the network in the course of performing the above-described method steps. Furthermore, method embodiments of the present invention may execute solely upon CPU 822 or may execute over a network such as the Internet in conjunction with a remote CPU that shares a portion of the processing.

In addition, embodiments of the present invention further relate to computer storage products with a computer-readable medium that have computer code thereon for performing various computer-implemented operations. The media and computer code may be those specially designed and constructed for the purposes of the present invention, or they may be of the kind well known and available to those having skill in the computer software arts. Examples of computer-readable media include, but are not limited to: magnetic media such as hard disks, floppy disks, and magnetic tape; optical media such as CD-ROMs and holographic devices; magneto-optical media such as floptical disks; and hardware devices that are specially configured to store and execute program code, such as application-specific integrated circuits (ASICs), programmable logic devices (PLDs) and ROM and RAM devices. Examples of computer code include machine code, such as produced by a compiler, and files containing higher level code that are executed by a computer using an interpreter. Computer readable media may also be computer code transmitted by a computer data signal embodied in a carrier wave and representing a sequence of instructions that are executable by a processor.

An etchant gas comprising of $O_2$, a sulfur component gas comprising at least one of $H_2S$ and a compound containing at least one carbon sulfur bond, a fluorine component, and an inert gas, such as Ar, Xe, or He. The compound containing at least one carbon sulfur bond may be provided by COS or $CS_2$. An example of an etchant gas may be 100-300 sccm Ar, 10-30 sccm $C_4F_6$, 8-30 sccm $O_2$, and 4 sccm $H_2S$. In a preferred embodiment of the invention, the sulfur component gas has a volume gas flow that is between 0.1-10% of the total volume of the etchant gas flow. In a more preferred embodiment, the sulfur component has a volume gas flow that is between 0.5-5% of the total volume of the etchant gas flow. In the most preferred embodiment, the sulfur component has a volume gas flow that is between 1-5% of the total volume of the etchant gas flow.

Figure 2B:
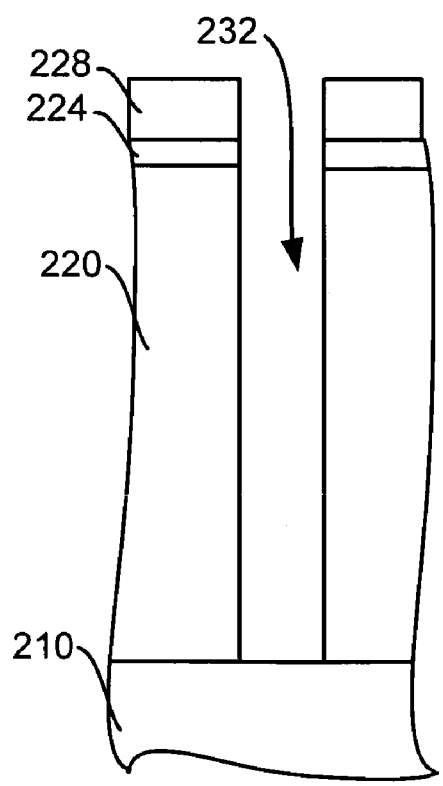

The etchant gas is converted to a plasma (step 120). In this example, the pressure in the plasma chamber is set at 25 mTorr. The RF source provides 1200 W Watts at 27 MHz and 1200 Watts at 2 MHz. The plasma from the etchant gas is used to etch features 232 into the dielectric layer 220, as shown in FIG. 2B (step 124). An ashing process may be used to remove the remaining photoresist mask, while the substrate is in the plasma processing chamber (step 128).

This embodiment may be used to etch silicon oxide based dielectric materials, such as silicon oxide and organo silicate glass. To etch silicon oxide based dielectric materials, a fluorine component is used in the etchant gas. In another manifestation of the invention, the invention may be used to etch low-k dielectrics, which may be either organic based or silicon oxide based. An example of an organic based low-k dielectrics that may be etched by the invention is SiLK. An example of a silicon-oxide low-k dielectric, which may be etched by the invention is organo silicate glass.

Preferably, the invention uses a photoresist of 193 nm or above. Such photoresists tend to have a low carbon to hydrogen ratio (C/H ratio) and are less etch resistant.

In this example, the features 232 are high aspect ratio features. In the specification and claims, a high aspect ratio feature is a feature with a height to width aspect ratio of at least 5:1.

If the sulfur component is $H_2S$, then a carbon source such as a fluorocarbon or hydrofluorocarbon is desired to provide carbon to form a carbon sulfur bond.

Test Results

Figure 5:
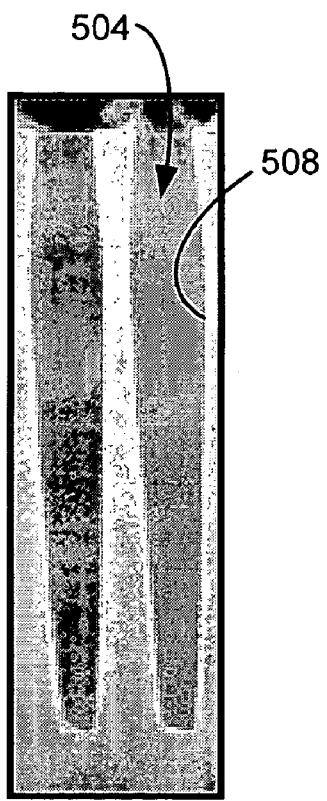
FIG. 5 is a profile of a contact etched without a sulfur containing component.

An etch using a plasma chemistry using an etchant gas of a Ar/$C_4F_6$/$O_2$ chemistry without $H_2S$ was performed and compared with an etch with an etchant gas of an Ar/$C_4F_6$/$O_2$ chemistry with an $H_2S$ addition for etching a silicon oxide based dielectric layer. FIG. 5 shows the profile 508 of a contact 504 etched using the above etchant gas without $H_2S$.

Figure 6:
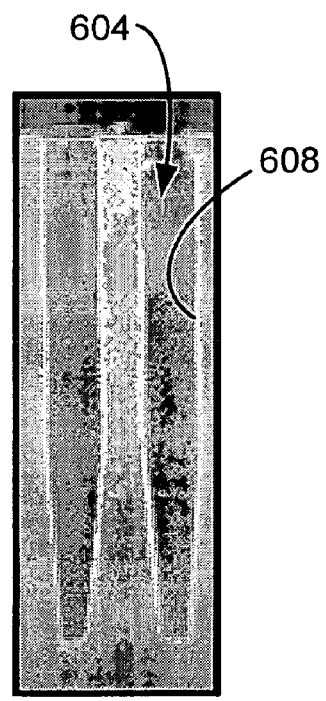
FIG. 6 is a profile of a contact etched with an $H_2S$ additive.

FIG. 6 shows the profile 608 of a contact 604 etched using an Ar/$C_4F_6$/$O_2$ chemistry with $H_2S$. A significant reduction in the bow CD is seen as $H_2S$ is added to the process by the straighter sidewalls of the etch profile 608.

Figure 7:
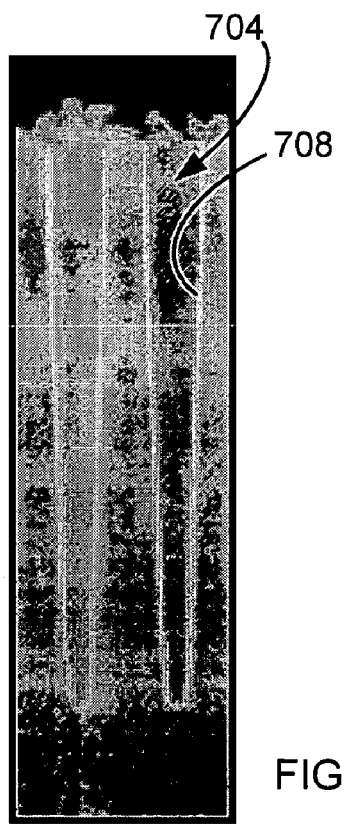
FIG. 7 is a profile of a contact etched with a COS additive.

FIG. 7 shows the profile 708 of the contact 704 etched using an Ar/$C_4F_6$/$O_2$ chemistry with a COS additive. A significant reduction in the bow CD is seen as COS is added to the process. Being iso-electronic with $CO_2$, which is a relatively inert chemical, the COS addition does not induce a shift in ER or in the selectivity of the fluorocarbon-based plasma etching processes. The profile control benefits of a sulfur containing fluorocarbon plasma etching chemistry are obtained.

Without wishing to be bound by theory, it is believed that polymer is formed to protect sidewalls of the features as the feature is formed, where the polymer sidewall helps to reduce bowing. The fluorocarbon or hydrofluorocarbon component may be used to provide the sidewall polymer. During a high aspect ratio etch, it is believed that the protective polymer sidewall is etched away at various parts by ion bombardment, which causes the bowing. It is believed that sulfur bonded to carbon, either that is formed during the process e.g. $H_2S$ and fluorocarbon, or is added directly to plasma e.g. COS, becomes incorporated into the sidewall polymer and makes the sidewall polymer more resistant to etching.

The invention does not use a component gas that has an oxygen sulfur bond, such as $SO_2$. Using $H_2S$ or a compound with a carbon sulfur bond provides advantages over using a component gas that has an oxygen sulfur bond, such as $SO_2$. It has been found that $SO_2$ causes undesirable effects such as loss of photoresist selectivity and loss of underlayer selectivity. In addition, some $SO_2$ processes use high concentrations of $SO_2$, because the $SO_2$ is believed to be used for purposes other than the use of a sulfur component practiced by the invention. The use of a sulfur component gas of at least one of $H_2S$ and carbon bonded sulfur helps avoid a sulfur bonded to oxygen.

In other embodiments of the invention, the etch layer may be un-doped or doped silicon dioxide (e.g. TEOS, BPSG, FSG etc), organo-silicate glass (OSG), or porous OSG.

There are many methods in which this invention can be applied for the contact etch process. One way is to add a small amount of $H_2S$ to a $C_xF_y$ and/or $C_xH_yF_z$, $O_2$, and inert gas plasma etching process during the full duration of etch. Another way is to pulse the $H_2S$ flow during the etch process, assuming that the basic chemistry (fluorocarbon and/or hydrofluorocarbon chemistry) is not modified. The $H_2S$ flow, the $H_2S$ pulsing periods and its frequency, can be adjusted as a function of the degree of difficulty of etch. Another method is to alternate sulfur containing plasma chemistries with non-sulfur containing plasma chemistries. The difference between the third method and the pulsing method is that the basic fluorocarbon and/or hydrofluorocarbon chemistry can be very different between different steps of the process. Different permutations of these suggested processes can be tailored for the particularities of a specific feature that has to be etched: aspect ratio, CD etc.

The process chamber can be a: CCP (capacitive coupled plasma) reactor or an ICP (inductive coupled plasma) reactor.

While this invention has been described in terms of several preferred embodiments, there are alterations, permutations modifications, and various substitute equivalents, which fall within the scope of this invention. It should also be noted that there are many alternative ways of implementing the methods and apparatuses of the present invention. It is therefore intended that the following appended claims be interpreted as including all such alterations, permutations, and various substitute equivalents as fall within the true spirit and scope of the present invention.

What is claimed is:

1. A method for etching a dielectric layer, wherein the dielectric layer is a silicon oxide based dielectric layer, over a substrate and disposed below a photoresist mask, comprising:
    placing the substrate in a plasma processing chamber;
    providing an etchant gas comprising a fluorine component, $O_2$, and a sulfur component gas comprising at least one of $H_2S$ and a compound containing at least one carbon sulfur bond into the plasma chamber, wherein the etchant gas has an etchant gas flow and the sulfur component gas has a sulfur component flow, wherein the sulfur component flow is between 0.1-10% of the etchant gas flow, wherein the fluorine component is at least one of a hydrofluorocarbon and a fluorocarbon;
    forming a plasma from the etchant gas; and
    etching features with a height to weight aspect ratio of at least 5:1 into the dielectric layer through the photoresist mask with the plasma from the etchant gas,
    wherein the etchant gas reduces bowing in the critical dimension of the etched features.

2. The method, as recited in claim 1, wherein the sulfur component gas comprises at least one of $H_2S$, COS, and $CS_2$.

3. The method, as recited in claim 1, wherein the silicon oxide based dielectric layer is organosilicate glass.

4. The method, as recited in claim 1, wherein the chemistry of components of the etchant gas other than the sulfur component gas is different during times in which the sulfur component gas is being provided than during times when the sulfur component gas is not being provided.

5. A method for etching a silicon oxide based dielectric layer over a substrate and disposed below a photoresist mask, comprising:
    placing the substrate in a plasma processing chamber;
    providing an etchant gas comprising a fluorine component, $O_2$ and a sulfur component gas comprising at least one of $H_2S$ and a compound containing at least one carbon sulfur bond into the plasma chamber, wherein the etchant gas has an etchant gas flow and the sulfur component gas has a sulfur component flow, wherein the sulfur component flow is between 0.1-10% of the etchant gas flow;
    forming a plasma from the etchant gas; and
    etching features with a height to width aspect ratio of at least 5:1 into the dielectric layer through the photoresist mask with the plasma from the etchant gas,
    wherein the etchant gas reduces bowing in the critical dimension of the etched features.

6. The method, as recited in claim 5, wherein the sulfur component gas comprises at least one of $H_2S$, COS, and $CS_2$.

7. The method, as recited in claim 6, wherein the fluorine component is at least one of a hydrofluorocarbon and a fluorocarbon.

* * * * *